United States Patent

Forrest et al.

(10) Patent No.: US 10,038,167 B2
(45) Date of Patent: Jul. 31, 2018

(54) THICK-ETL OLEDS WITH SUB-ITO GRIDS WITH IMPROVED OUTCOUPLING

(71) Applicant: The Regents of the University of Michigan, Ann Arbor, MI (US)

(72) Inventors: Stephen R. Forrest, Ewing, NJ (US); Yue Qu, Ewing, NJ (US); Michael Slootsky, Ewing, NJ (US)

(73) Assignee: The Regents of the University of Michigan, Ann Arbor, MI (US)

( * ) Notice: Subject to any disclaimer, the term of this patent is extended or adjusted under 35 U.S.C. 154(b) by 72 days.

(21) Appl. No.: 14/991,178

(22) Filed: Jan. 8, 2016

(65) Prior Publication Data

US 2016/0204387 A1    Jul. 14, 2016

Related U.S. Application Data

(60) Provisional application No. 62/101,026, filed on Jan. 8, 2015.

(51) Int. Cl.
*H01L 51/52* (2006.01)
*H01L 51/00* (2006.01)

(52) U.S. Cl.
CPC ...... *H01L 51/5275* (2013.01); *H01L 51/0017* (2013.01); *H01L 51/5212* (2013.01); *H01L 2251/308* (2013.01)

(58) Field of Classification Search
CPC ............. H01L 51/5275; H01L 51/5212; H01L 51/0017
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |

(Continued)

FOREIGN PATENT DOCUMENTS

| | | |
|---|---|---|
| EP | 1238981 | 9/2002 |
| JP | 2010/135467 | 6/2010 |

(Continued)

OTHER PUBLICATIONS

Y. Sun and S.R. Forrest, "Enhanced light out-coupling of organic light-emitting devices using embedded low-index grids," Nat. Photonics 2, 483 (2008).*

(Continued)

*Primary Examiner* — Douglas Menz
(74) *Attorney, Agent, or Firm* — Riverside Law LLP

(57) ABSTRACT

An organic light emitting device is described. In certain embodiments, the device has a transparent substrate, a transparent grid layer disposed over the substrate, and an OLED disposed over the grid layer. The OLED can include an anode, a cathode, and at least one organic layer between the anode and cathode. A refractive index of the transparent grid layer is less than or equal to a refractive index of the transparent substrate. In certain embodiments, the at least one organic layer includes an electron transport layer having a thickness of at least 50 nm. In certain embodiments, the refractive index of the transparent grid layer is less than n=1.20, or in certain embodiments, less than n=1.05. Methods of manufacturing an organic light emitting device are also described.

16 Claims, 15 Drawing Sheets

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 7,279,704 | B2 | 10/2007 | Walters et al. |
| 7,431,968 | B1 | 10/2008 | Shtein et al. |
| 7,968,146 | B2 | 6/2011 | Wanger et al. |
| 2003/0164496 | A1 | 9/2003 | Do et al. |
| 2003/0230980 | A1 | 12/2003 | Forrest et al. |
| 2004/0174116 | A1 | 9/2004 | Lu et al. |
| 2004/0183433 | A1 | 9/2004 | Cho et al. |
| 2006/0062270 | A1 | 3/2006 | Okutani et al. |
| 2006/0175962 | A1 | 8/2006 | Fujimoto et al. |
| 2007/0090350 | A1* | 4/2007 | Lee ............... H01L 27/322 257/40 |
| 2011/0180836 | A1 | 7/2011 | Son |
| 2011/0262093 | A1 | 10/2011 | Lamansky et al. |
| 2013/0026452 | A1 | 1/2013 | Kottas et al. |
| 2013/0119354 | A1 | 5/2013 | Ma et al. |
| 2014/0001448 | A1 | 1/2014 | Naraoka et al. |
| 2015/0115226 | A1 | 4/2015 | Scire et al. |
| 2015/0144928 | A1* | 5/2015 | Forrest ............ H01L 51/5275 257/40 |

FOREIGN PATENT DOCUMENTS

| | | |
|---|---|---|
| WO | 2004/111066 | 12/2004 |
| WO | 2008/044723 | 4/2008 |
| WO | 2008057394 | 5/2008 |
| WO | 2010011390 | 1/2010 |
| WO | 2010/111175 | 9/2010 |

OTHER PUBLICATIONS

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 1, 4-6 (1999).

M. Slootsky and S.R. Forrest, "Full-wave simulation of enhanced outcoupling of organic light-emitting devices with an embedded low-index grid," Appl. Phys. Lett. 94, 163302 (2009).

M. Slootsky and S.R. Forrest, "Enhancing waveguided light extraction in organic LEDs using an ultra-low-index grid," Opt. Lett. 35, 1052-1054 (2010).

Bulovic, et al., "Weak microcavity effects in organic light-emitting devices", Phys Rev B 1998; 58:3730-3740.

Chang, et al., "Nano-particle based scattering layers for optical efficiency enhancement of organic light-emitting diodes and organic solar cells", Journal of Applied Physics 113, 204502 (2013): doi: 10.1063/1.4807000, 2013, 9 pages.

Fouckhardt, et al., "nm-and μm-Scale Surface Roughness on Glass with Specific Optical Scattering Characteristics on Demand", Hindawi Publishing Corporation Advances in OptoElectronics vol. 2007, Article ID 27316, 2007, 7 pages.

Lu, et al., "External coupling efficiency in planer organic light-emitting devices", Applied Physics Letters 78, 1927 (2001); doi: 10.1063/1.1357207, Mar. 26, 2001, 4 pages.

Moller, et al., "Improved light out-coupling in organic light emitting diodes employing ordered microlens arrays", Journal of Applied Physics 91, 3324 (2002); doi: 10.1063/1.1435422, Mar. 1, 2002, 4 pages.

Riedel, et al., "Improving the outcoupling efficiency of indium-tin-oxide-free organic light-emitting diodes via rough internal interfaces", Nov. 8 2010 / vol. 18, No. S4 / Optics Express A 639, Oct. 28, 2010, 9 pages.

Sun, et al., "Organic light emitting devices with enhanced outcoupling via microlenses fabricated by imprint lithography", Journal of Applied Physics 100, 073106 (2006), Oct. 11, 2006, 6 pages.

* cited by examiner

Air Grid:

Buried Grid:

@65nm ETL
about 20%
enhancement

@230nm ETL
enhancement up
to 50%

THICK-ETL OLEDS WITH SUB-ITO GRIDS WITH IMPROVED OUTCOUPLING

CROSS-REFERENCE TO RELATED APPLICATIONS

This application is a non-provisional of U.S. Patent Application Ser. No. 62/101,026, filed Jan. 8, 2015, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to improvement of outcoupling efficiency of devices using a combination of sub-ITO grids, optional thick electron transport layers in sub-ITO grid devices, and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted Ir(ppy)$_3$, which has the following structure:

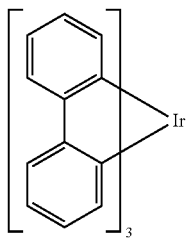

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

In a conventional OLED architecture, light is produced within the organic layers and is emitted through the transparent electrode (ITO) and substrate (glass). Due to the high refractive index of the organic and ITO layers, a large portion of the produced light is trapped in so-called waveguide modes which reside mainly in these layers, but also partly extend into the substrate. The light travels parallel to the layer and is eventually lost to material absorption.

What is needed in the art is a device and method for improving out-coupling efficiency of devices.

SUMMARY OF THE INVENTION

According to an embodiment, an organic light emitting device, includes a transparent substrate; a transparent grid layer disposed over the substrate; and an OLED disposed over the grid layer, wherein the OLED includes an anode, a cathode, and at least one organic layer between the anode and cathode; wherein a refractive index of the transparent grid layer is less than or equal to a refractive index of the transparent substrate. In one embodiment, the at least one organic layer includes an electron transport layer having a thickness of at least 50 nm. In one embodiment, the refractive index of the transparent grid layer is less than n=1.20. In one embodiment, the refractive index of the transparent grid layer is less than n=1.05. In one embodiment, the grid layer comprises a material patterned at least partially within the transparent substrate. In one embodiment, the material is a dielectric material. In one embodiment, the material is $TiO_2$. In one embodiment, the transparent substrate comprises glass. In one embodiment, the pattern comprises a plurality of space-filling polyhedra substantially aligned in rows and columns. In one embodiment, sides of the space-filling polyhedra have a step height of less than 10 nm. In one embodiment, sides of the space-filling polyhedra have a step height of less than 8 nm. In one embodiment, the space-filling polyhedra are substantially one of square, triangular or hexagonal. In one embodiment, the grid layer comprises a material having a pattern of voids etched therein. In one embodiment, the material is a dielectric material. In one embodiment, the material is $TiO_2$. In one embodiment, the pattern comprises a plurality of quadrilaterals substantially aligned rows and columns. In one embodiment, the at least one organic layer includes an electron transport layer having a thickness of at least 75 nm. In one embodiment, the electron transport layer has a thickness of at least 100 nm. In one embodiment, the electron transport layer has a thickness of at least 200 nm. In one embodiment, the anode is transparent. In one embodiment, the anode comprises indium tin oxide. In one embodiment, the organic light emitting device includes a micro-lens array. In one embodiment, the substrate quantum efficiency is increased by at least 40%. In one embodiment, the substrate quantum efficiency is increased by at least 50%. In one embodiment, the external quantum efficiency is increased by at least 30%. In one embodiment, the external quantum efficiency is increased by at least 40%.

In one embodiment, method of manufacturing an organic light emitting device includes the steps of etching a pattern of recesses into the surface of a transparent substrate; disposing a transparent material at least partially within the pattern of recesses to form a transparent grid layer; and disposing an OLED over the grid layer, wherein the OLED includes an anode, a cathode, and at least one organic layer between the anode and cathode; where a refractive index of the transparent grid layer is less than or equal to a refractive index of the transparent substrate. In one embodiment, the at least one organic layer includes an electron transport layer having a thickness of at least 50 nm. In one embodiment, the refractive index of the transparent grid layer is less than n=1.20. In one embodiment, the refractive index of the transparent grid layer is less than n=1.05. In one embodiment, the material is a dielectric material. In one embodiment, the material is $TiO_2$. In one embodiment, the transparent substrate comprises glass. In one embodiment, the pattern comprises a plurality of space-filling polyhedra substantially aligned in rows and columns. In one embodiment, sides of the space-filling polyhedra have a step height of less than 10 nm. In one embodiment, sides of the space-filling polyhedra have a step height of less than 8 nm. In one embodiment, the space-filling polyhedra are substantially one of square, triangular or hexagonal. In one embodiment, the at least one organic layer includes an electron transport layer having a thickness of at least 75 nm. In one embodiment, electron transport layer has a thickness of at least 100 nm. In one embodiment, the electron transport layer has a thickness of at least 200 nm.

In one embodiment, a method of manufacturing an organic light emitting device includes the steps of etching a pattern of recesses into a transparent material to form a grid layer; bonding a transparent substrate to the grid layer; and disposing an OLED over the grid layer, wherein the OLED includes an anode, a cathode, and at least one organic layer between the anode and cathode; where a refractive index of the transparent grid layer is less than or equal to a refractive index of the transparent substrate. In one embodiment, the at least one organic layer includes an electron transport layer having a thickness of at least 50 nm. 29. In one embodiment, the refractive index of the transparent grid layer is less than n=1.20. In one embodiment, the refractive index of the transparent grid layer is less than n=1.05. In one embodiment, the transparent material is a dielectric material. In one embodiment, the transparent material is $TiO_2$. In one embodiment, the pattern of recesses comprises a plurality of recessed space-filling polyhedra substantially aligned in rows and columns. In one embodiment, the space-filling polyhedra are substantially one of square, triangular or hexagonal. In one embodiment, the at least one organic layer includes an electron transport layer having a thickness of at least 75 nm. In one embodiment, the electron transport layer has a thickness of at least 100 nm. In one embodiment, the electron transport layer has a thickness of at least 200 nm.

According to another embodiment, a first device comprising a first organic light emitting device is also provided. The first organic light emitting device can include an anode, a cathode, and an organic layer, disposed between the anode and the cathode. Alternatively, the organic light emitting device includes a transparent substrate; a transparent grid layer disposed over the substrate; and an OLED disposed over the grid layer, wherein the OLED includes an anode, a cathode, and at least one organic layer between the anode and cathode; wherein a refractive index of the transparent grid layer is less than or equal to a refractive index of the transparent substrate. The organic layer can include an electron transport layer having a thickness of at least 50 nm. The refractive index of the transparent grid layer can be less than n=1.20, or in certain embodiments, less than n=1.05. The first device can be a consumer product, an organic light-emitting device, and/or a lighting panel.

DETAILED DESCRIPTION

Figure 1:
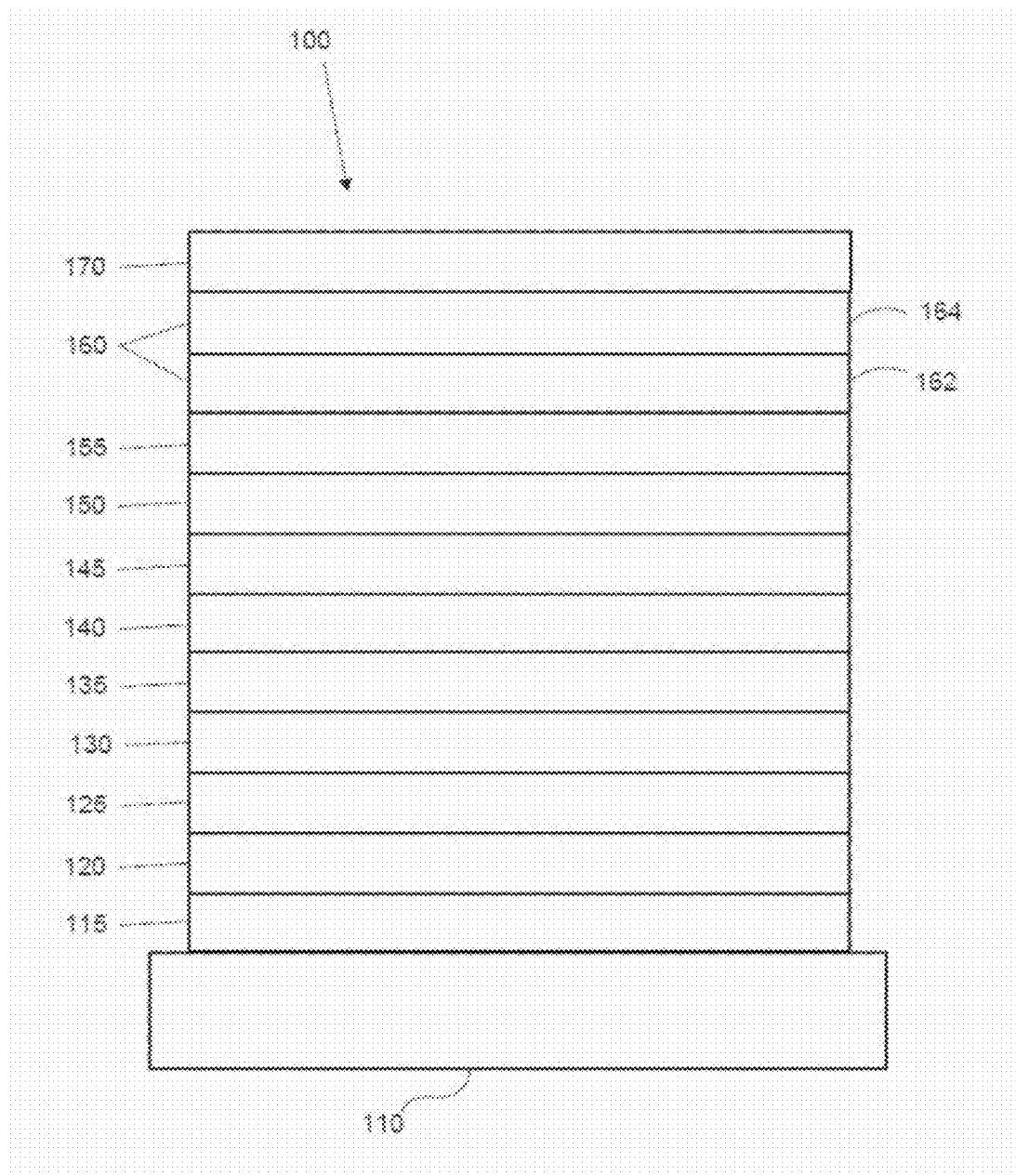
FIG. 1 shows an organic light emitting device.

It is to be understood that the figures and descriptions of the present invention have been simplified to illustrate elements that are relevant for a more clear comprehension of the present invention, while eliminating, for the purpose of clarity, many other elements found in OLEDs and methods of manufacturing the same. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Ranges: throughout this disclosure, various aspects of the invention can be presented in a range format. It should be understood that the description in range format is merely for convenience and brevity and should not be construed as an inflexible limitation on the scope of the invention. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
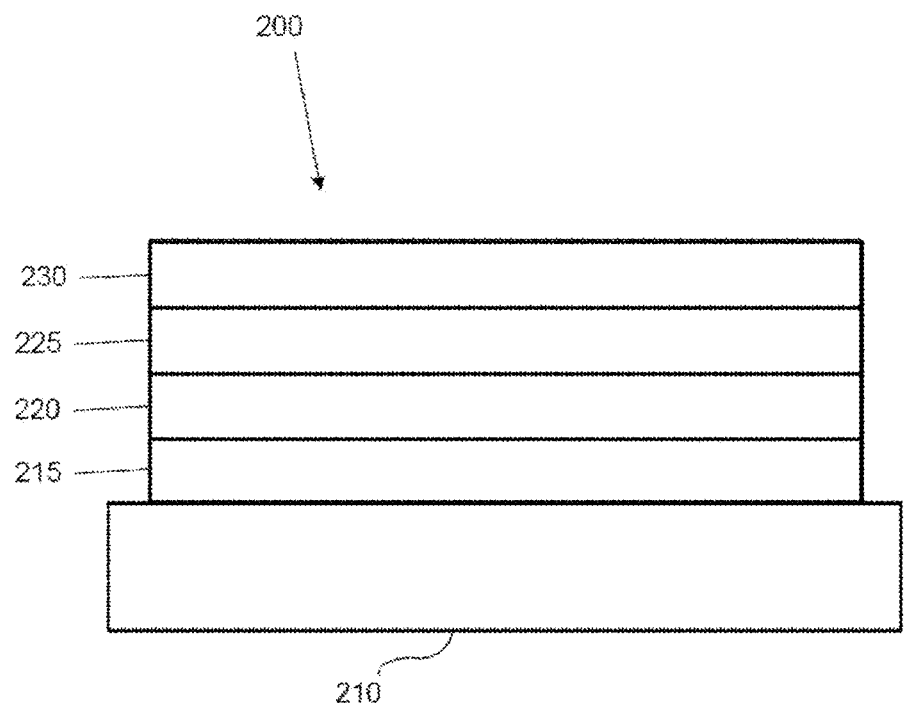
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Figure 3:
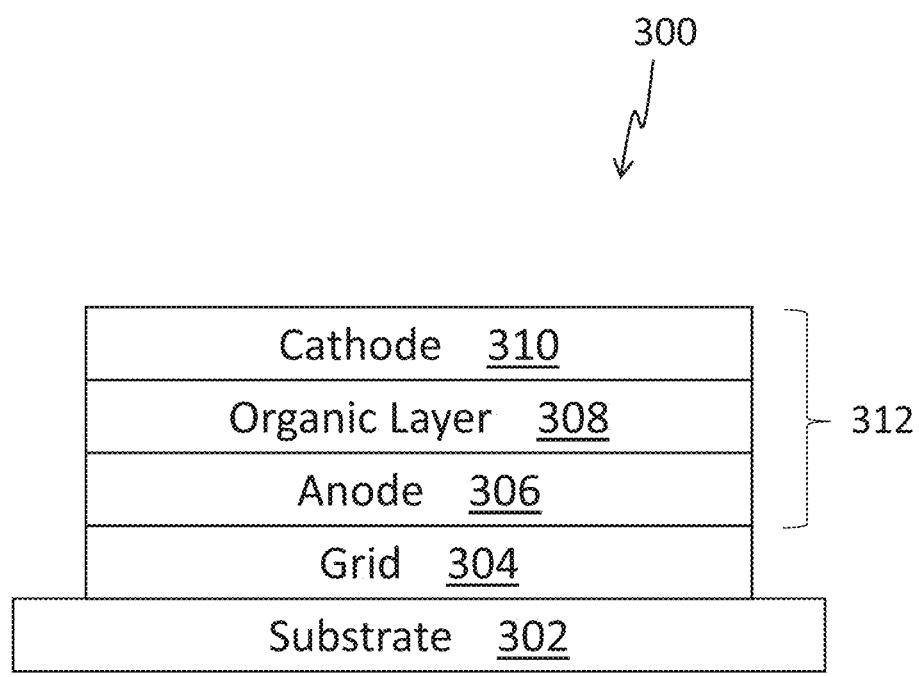
FIG. 3 shows an OLED device according to one embodiment.

With reference now to FIG. 3, in one embodiment, an organic light emitting device 300 includes a transparent substrate 302, a transparent grid layer 304 disposed over the substrate 302, and an OLED 312 disposed over the grid layer 304, wherein the OLED 312 includes an anode 306, a cathode 310 and at least one organic layer 308 between the anode 306 and cathode 310. In one embodiment, the anode is transparent. In one embodiment, the anode is made of indium tin oxide. In one embodiment, the organic light emitting device includes a micro-lens array. In one embodiment, a refractive index of the transparent grid layer is less than n=1.20. In certain embodiments, a grid with a low refractive index is utilized. In one embodiment, the refractive index of the grid is less than or equal to the refractive index of the substrate. In certain embodiments, the refractive index of the grid is less than n=1.20, n=1.15, n=1.10 or n=1.05. In certain embodiments, the refractive index is about n=1.15. In certain embodiments, the refractive index is about n=1.03. Further embodiments of low index grids that can be used with the embodiments described herein are disclosed in Y. Sun and S. R. Forrest, "Enhanced light out-coupling of organic light-emitting devices using embedded low-index grids,"*Nat. Photonics* 2, 483 (2008); M. Slootsky and S. R. Forrest, "Full-wave simulation of enhanced outcoupling of organic light-emitting devices with an embedded low-index grid,"*Appl. Phys. Lett.* 94, 163302 (2009); and M. Slootsky and S. R. Forrest, "Enhancing waveguided light extraction in organic LEDs using an ultra-low-index grid,"*Opt. Lett.* 35, 1052-1054 (2010); the entire contents of which are each incorporated herein by reference. In one embodiment, grid materials include magnesium fluoride, silica aerogels (e.g. n=1.03), obliquely deposited porous silicon dioxide (n—1.05), or materials having indices close to that of air. In one embodiment, the grid is made of $SiO_2$ deposited on a prepatterned ITO-coated glass at an oblique angle.

In certain embodiments, the OLED devices may include an organic layer having at least one electron transport layer of either standard thickness or increased thickness. For example, in certain embodiments, the at least one organic layer includes an electron transport layer having a thickness of at least 50 nm. In one embodiment, the organic layer includes an electron transport layer having a thickness of at least 75 nm. In one embodiment, the electron transport layer has a thickness of at least 100 nm, or a minimum thickness of at least 200 nm in another embodiment. The electron transport can have a thickness of at least 50 nm, 75 nm, 100 nm, 125 nm, 150 nm, 175 nm, 200 nm or more in certain embodiments.

As mentioned previously, the OLED devices may include a transparent grid layer. For example, in certain embodiments, the grid layer is made of a material patterned at least partially within the transparent substrate, such as a glass substrate. In one embodiment, the material is a dielectric material, such as $TiO_2$. According to embodiments described herein, a separate transparent grid layer may be created between the ITO electrode and substrate.

The refractive index of host layer and embedded grid can be varied independently. Moreover, all the geometric parameters of the grid can be varied without restrictions. The thickness of sub-ITO grid layer can be used to tune the optical field within OLEDs. By optimizing all these parameters, sub-ITO grids can out-couple a significant portion of waveguided optical power in conventional OLEDs. To further enhance the advantages of devices having sub-ITO grid layers, the thickness of electron transport layer (ETL) can be increased to minimize the coupling rate into surface plasma modes, and to enhance the waveguide power that can be out coupled by sub-ITO grids eventually.

In one embodiment, the grid pattern is a plurality of space-filling polyhedra substantially aligned in rows and columns. In one embodiment, sides of the space-filling polyhedra have a step height of less than 10 nm. In one embodiment, sides of the space-filling polyhedra have a step height of less than 8 nm. Examples of space-filling polyhedra include but are not limited to squares, triangles or hexagons. In one embodiment, the geometries have rounded edges, and can be generally circular or oval shaped. In one embodiment, the grid is a pattern of 6 μm×6 μm square openings with a 1 μm spacing. In certain embodiments, the period of the pattern on the grid can be 8-12 times the visible wavelength, or 10 times the visible wavelength in one embodiment. The grid layer can include a material having a pattern of voids etched therein in certain embodiments. Like previous embodiments, the material can be a dielectric material, such as $TiO_2$. The pattern can likewise comprises a plurality of quadrilaterals substantially aligned rows and columns. In one embodiment, the perimeter of the grid is less than the perimeter of the adjacent ITO layer. The shape of the grid can match the ITO layer in one embodiment, and in other embodiments, the grid is a different shape, and the perimeter of the grid fits within the perimeter of the ITO layer.

Embodiments of the device demonstrate a measurable increase in efficiency. High-angle modes are refracted towards the substrate normal, increasing out-coupling efficiency. In one embodiment, the substrate quantum efficiency is increased by at least 10%, at least 20%, at least 30%, at least 40%, or at least 50% in other embodiments. In one embodiment, the external quantum efficiency is increased by at least 10%, at least 20%, at least 30%, at least 40%, or at least 50% in other embodiments.

Advantageously, thick ETLs optionally included in the OLED can help eliminate short currents, resulted from the roughness introduced by fabrication of sub-grid structure. Thus, a thicker ETL provides more tolerance for the surface quality of sub-ITO grid layer, which further reduces the difficulties of sub-ITO grid fabrication. An improvement over conventional OLED devices, combining the thick ETL layer with the grid as disclosed herein results in an unexpected and significant improvement over the prior art for increasing out-coupling efficiency.

The sub-grid can be manufactured by different fabrication methods including, without limitation, lithography followed by etching and planarization of the substrate or host material; nanoimprint patterning of the grid followed by planarization; or pattering of a void grid followed by lamination of a thin planar overlayer; or etching and refilling followed by photoresist lift-off. The ultra-thick ETL can be manufactured by conventional vacuum thermal evaporation, depositing electron transfer organic material doped with alkali metal, such as Li and Cs, or by any other technique understood in the art.

Figure 4A:
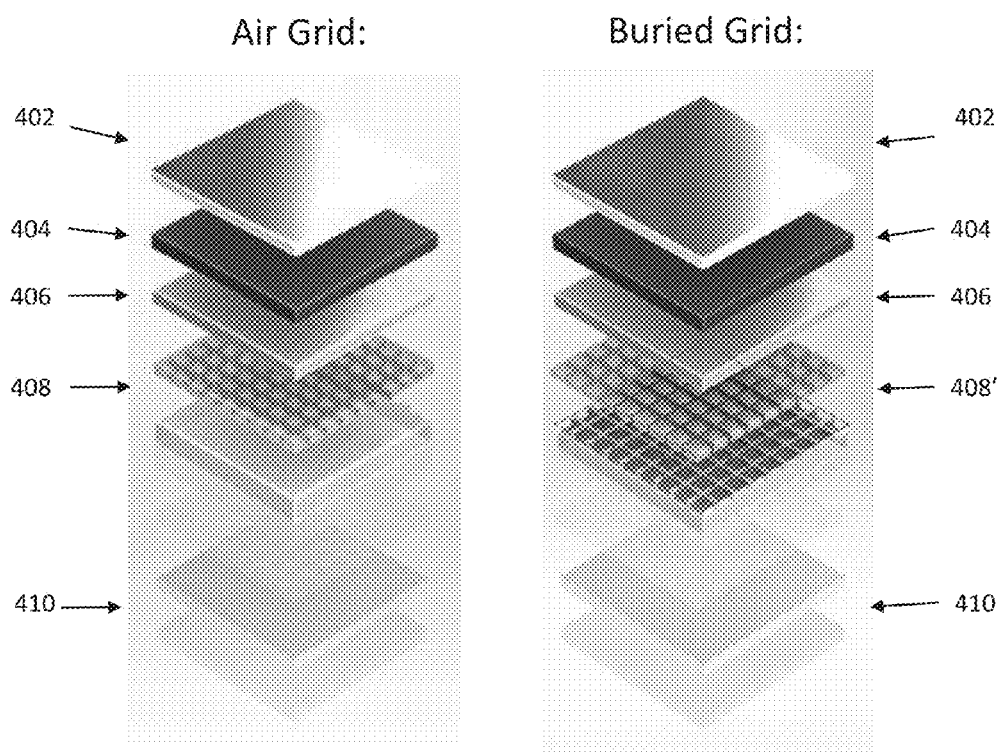
FIGS. 4A and 4B show exploded views of an air grid vs. a buried grid (FIG. 4A) and manufactured views of an air grid vs. a buried grid (FIG. 4B) respectively, according to one embodiment.
Figure 4B:
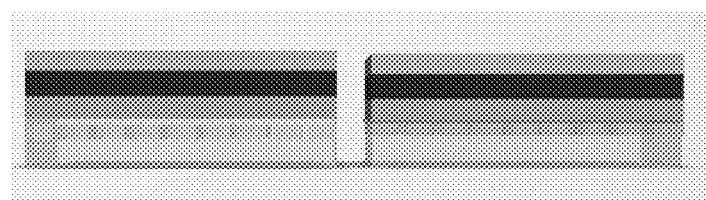

With reference now to FIGS. 4A and 4B, an exploded view of the air grid vs. buried grid device layers are shown according to one embodiment (FIG. 4A), along with the assembled view of each respectively (FIG. 4B). An organic layer 404 is disposed between a top Al electrode 402 (the cathode), and a bottom ITO electrode 406 (the anode). Alternate cathode and anode materials can be utilized as understood in the art. The respective grid structures 408, 408' are set underneath the ITO layer 406, and are built upon a transparent substrate 410.

Figure 5A:
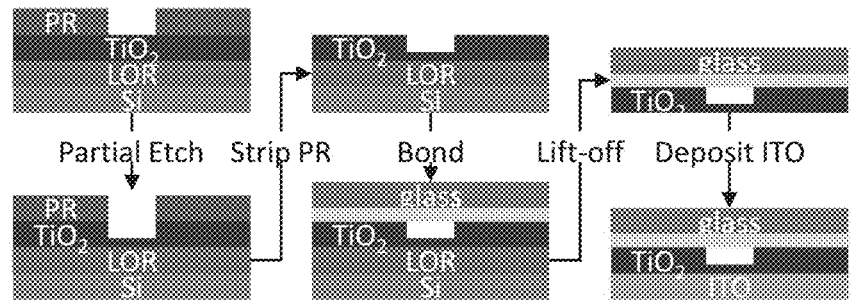
FIG. 5A shows a method of manufacturing an air grid.

A method of manufacturing an air grid is illustrated in FIG. 5A. In one embodiment, a pattern of recesses are etched into a transparent material to form a grid layer and a transparent substrate is bonded to the grid layer. As shown specifically in the embodiment of FIG. 5A, a pattern of photoresist is placed over a layer of $TiO_2$, LOR and SI. A partial etch is made into the $TiO_2$ layer. The photoresist layer is removed, and a layer of glass is bonded onto the partially etched $TiO_2$ layer. The layers above the LOR are lifted off and deposited onto a layer of ITO. In one embodiment, an OLED is disposed over the grid layer, including a transparent anode (e.g., ITO), a cathode, and at least one organic layer between the anode and cathode.

Figure 5B:
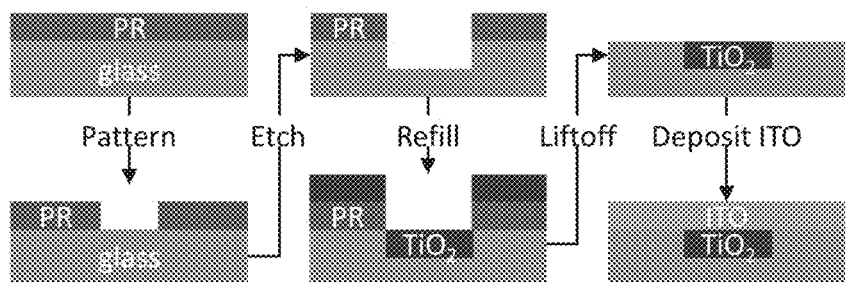
FIG. 5B shows a method of manufacturing a buried grid according to one embodiment.

A method of manufacturing a buried grid is illustrated in FIG. 5B. In one embodiment, a pattern of recesses are etched into the surface of a transparent substrate. A transparent material is disposed at least partially within the pattern of recesses to form a transparent grid layer. As shown specifically in the embodiment of FIG. 5B, a patterned layer of photoresist is placed over a layer of glass. The glass is then etched and a layer of $TiO_2$ is then refilled over the layer of photoresist, filling the etch in the glass. The layer of glass containing the $TiO_2$ filled etch is then separated from the photoresist, and a layer of ITO is deposited above the layer of glass and $TiO_2$.

EXPERIMENTAL EXAMPLES

The invention is now described with reference to the following Examples. These Examples are provided for the purpose of illustration only and the invention should in no way be construed as being limited to these Examples, but rather should be construed to encompass any and all variations which become evident as a result of the teaching provided herein.

Without further description, it is believed that one of ordinary skill in the art can, using the preceding description and the following illustrative examples, make and utilize the present invention and practice the claimed methods. The following working examples therefore, specifically point out the preferred embodiments of the present invention, and are not to be construed as limiting in any way the remainder of the disclosure.

Figure 6:
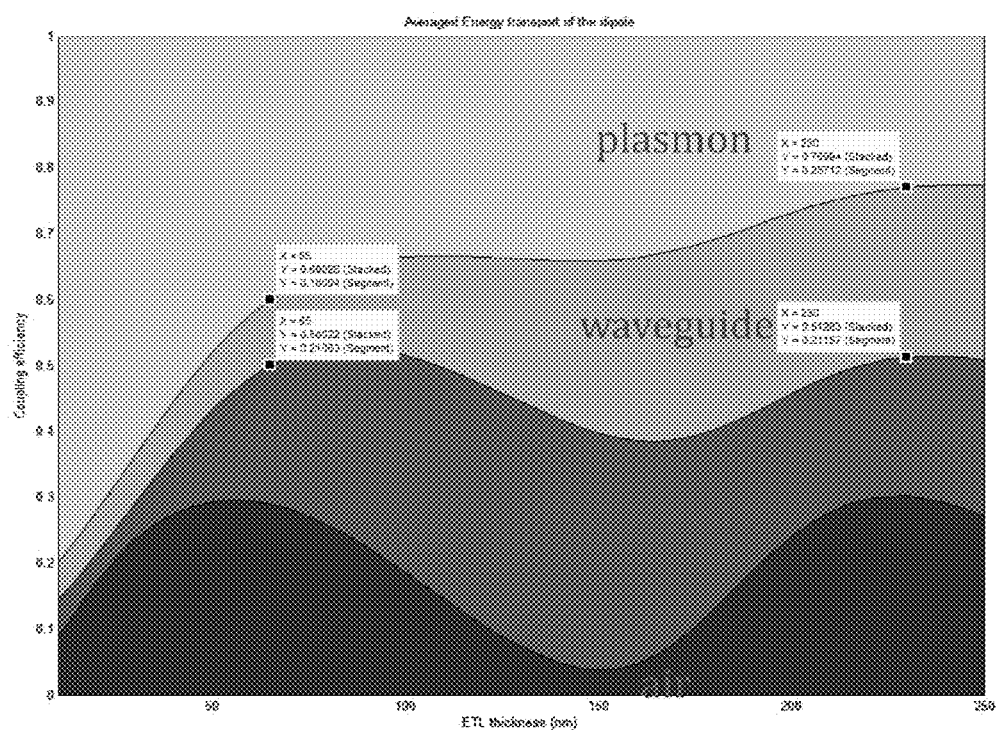
FIG. 6 is a graph of coupling efficiency over a range of ETL thicknesses according to one embodiment.
Figure 7A:
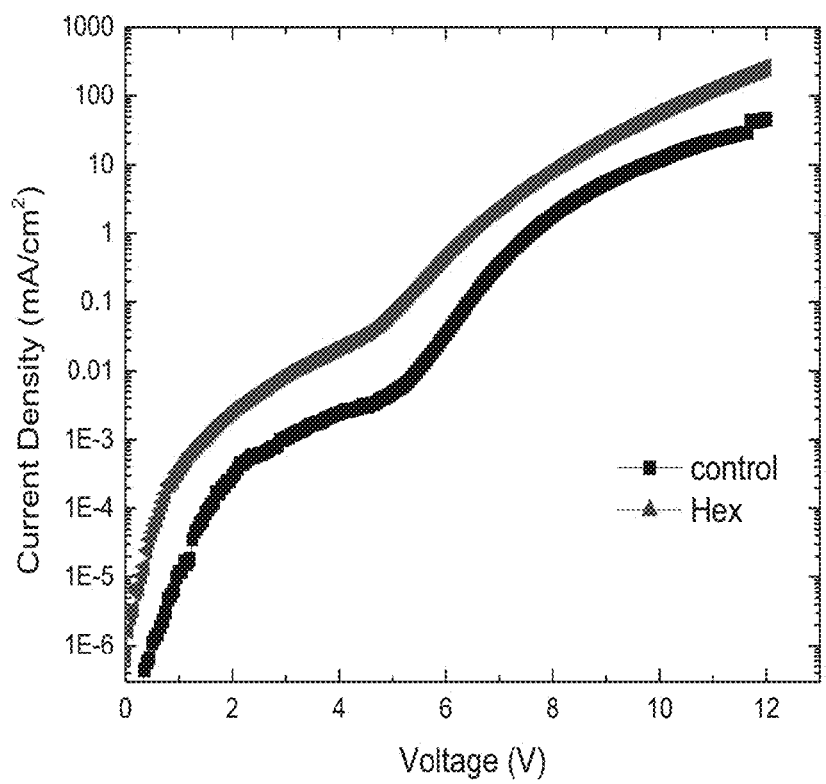
FIGS. 7A and 7B are graphs of current density and quantum efficiency according to one embodiment.
Figure 7B:
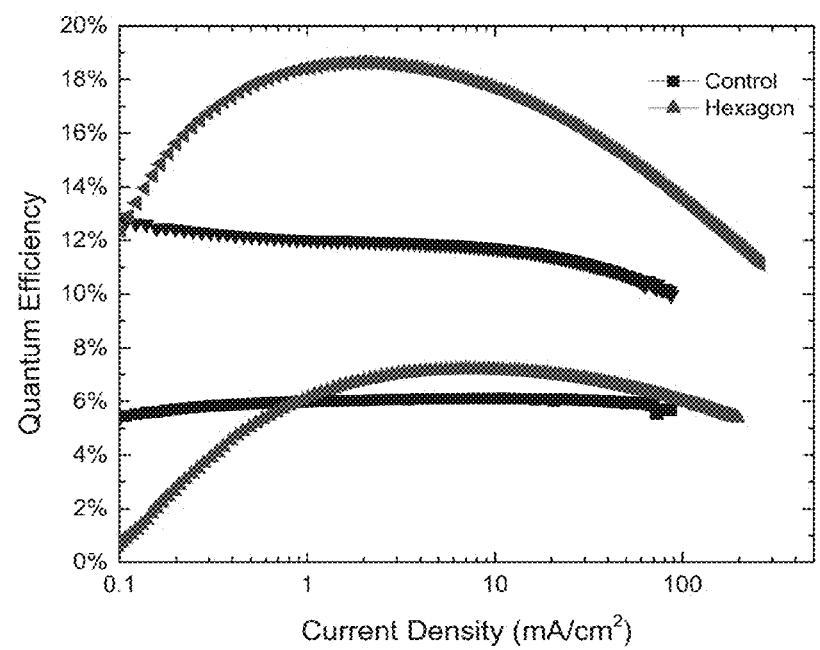

The exemplary effects of out-coupling efficiency on ETL thickness is shown in FIG. 6. In certain embodiments, sub-ITO grid device performance can be enhanced by including ultra-thick ETLs. With ultra-thick-ETL, sub-ITO grids are able to enhance the substrate quantum efficiency by up to, or at least 50% comparing to conventional devices, as shown in FIGS. 7A and 7B. OLED devices with grids having a hexagonal pattern are shown in comparison to conventional OLED devices. Ultra-thick sub-ITO grid OLEDs external quantum efficiency can be enhanced even further, up to or more than 40%, by application of substrate out-coupling technics, such as micro-lens array.

Figure 8A:
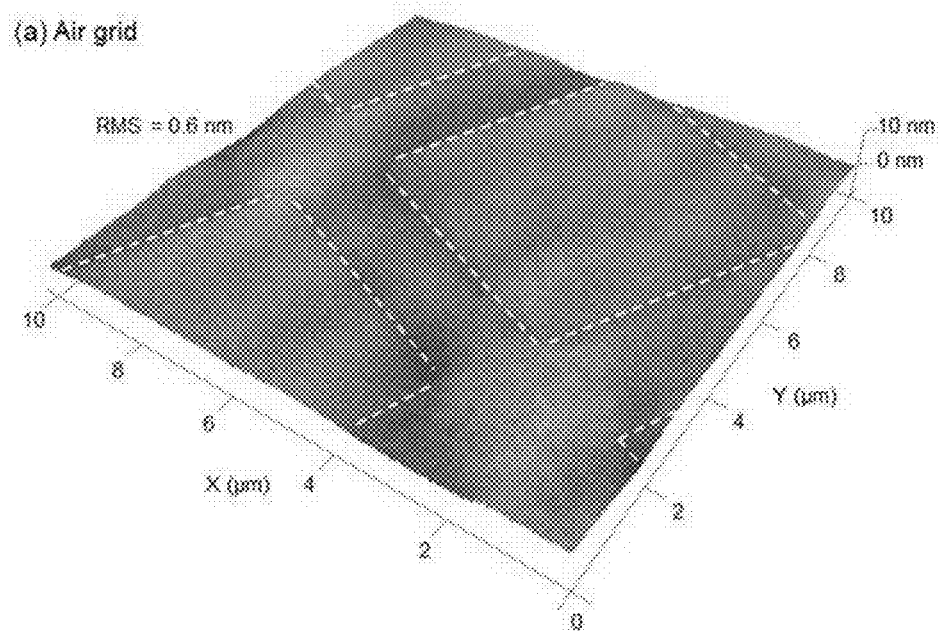
FIG. 8A, is an image of an air grid, and graphs are also shown illustrating the current density vs. voltage in FIG. 8B, EQE vs. current density in FIG. 8C, and air & glass mode vs. current density in FIG. 8D according to one embodiment.
Figure 8B:
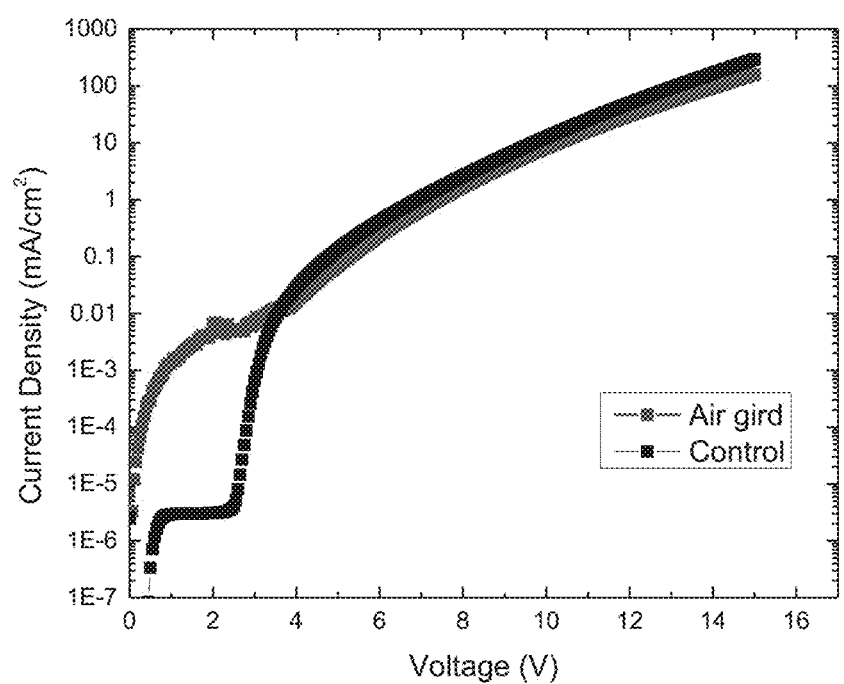
Figure 8C:
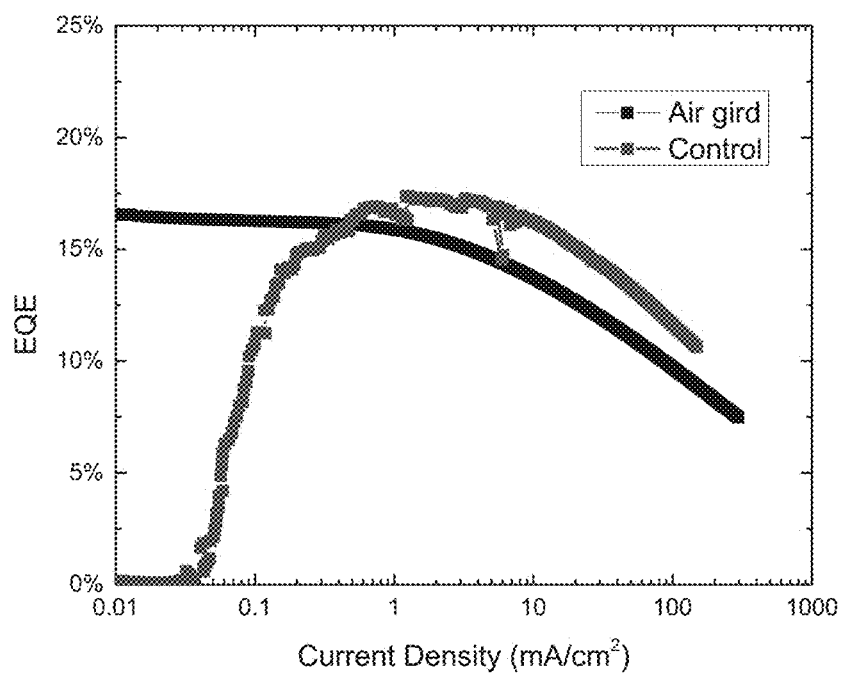
Figure 8D:
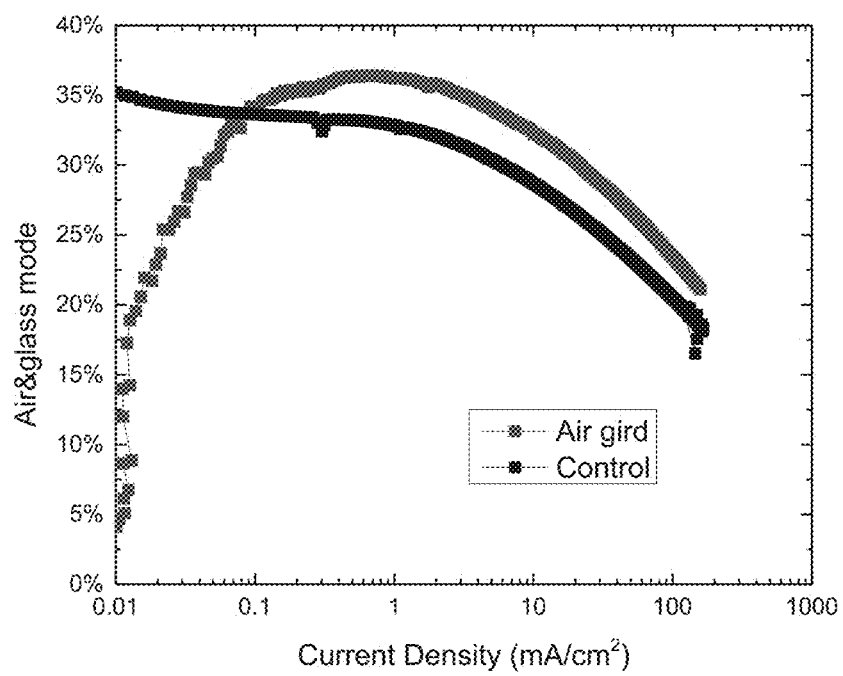

As shown in FIG. 8A, an air grid can be manufactured with a square pattern geometry having an RMS=0.6 nm. Current density for the air grid vs. a control are shown in FIG. 8B, along with EQE (FIG. 8C) and air & glass mode (FIG. 8D) vs. current density. A flat surface can be formed using the air grid. Large spikes were produces while the ITO was annealing. Poor surface conditions tending to cause large leakage current. Air mode improved partially cause by a rough grid surface.

Figure 9A:
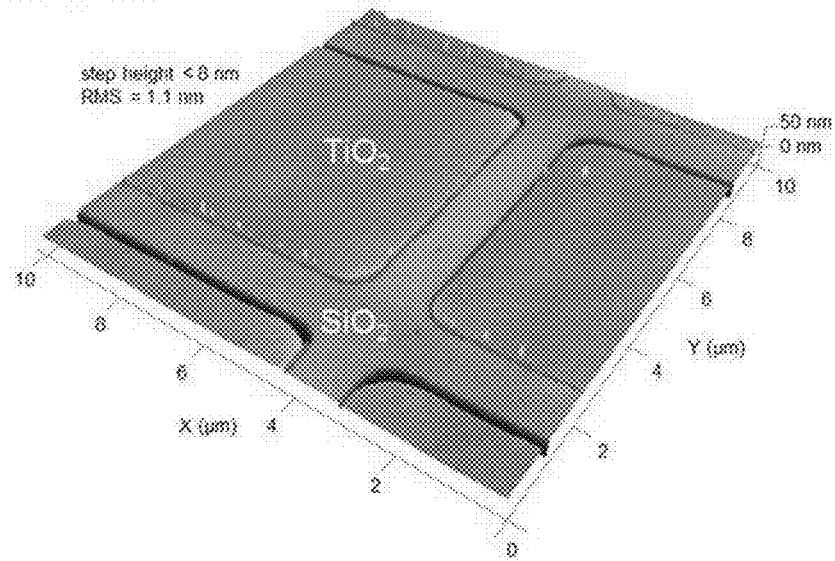
FIG. 9A, is an image of a buried grid, and graphs are also shown illustrating the current density vs. voltage in FIG. 9B, EQE vs. current density in FIG. 9C, air & glass mode vs. current density in FIG. 9D, and intensity vs. wavelength in FIG. 9E according to one embodiment.
Figure 9B:
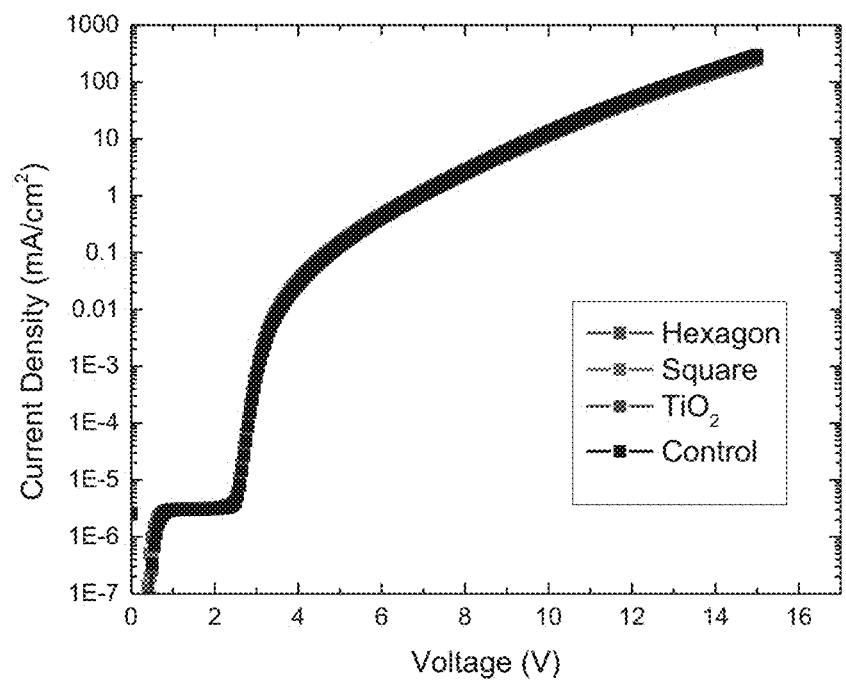
Figure 9C:
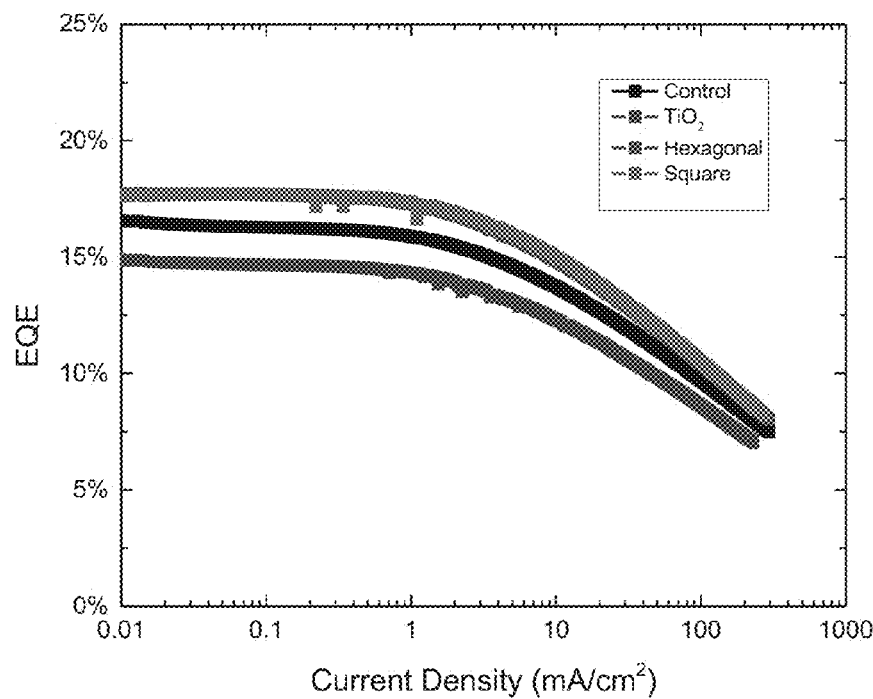
Figure 9D:
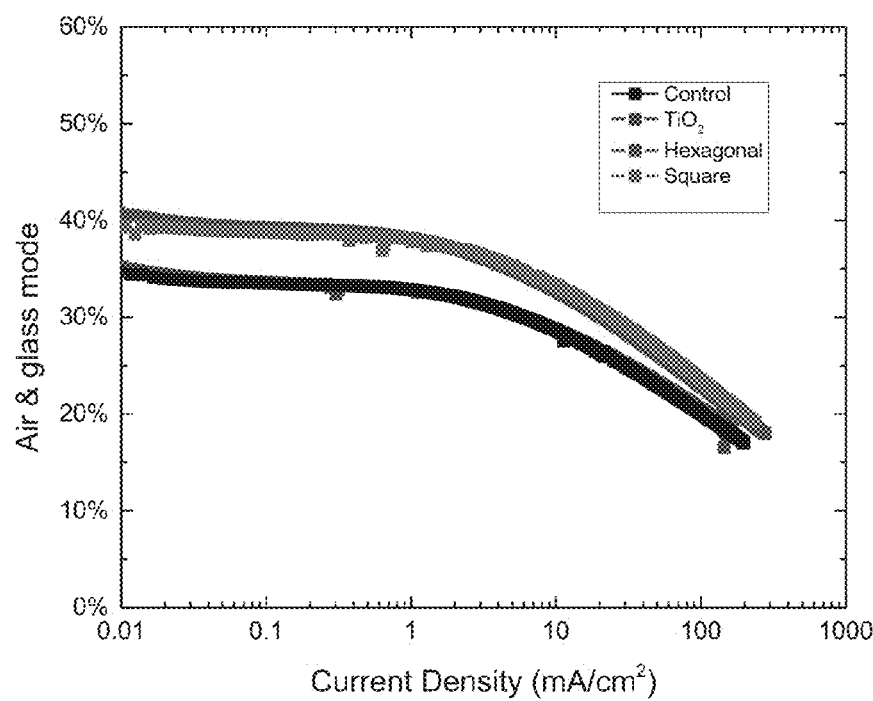
Figure 9E:
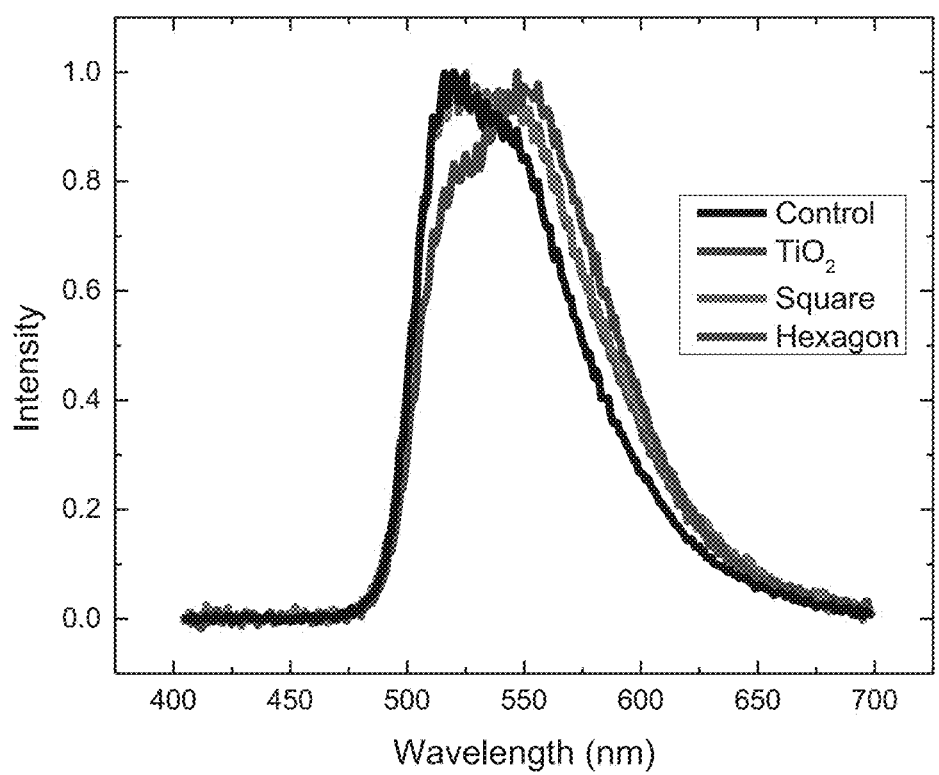
Figure 10:
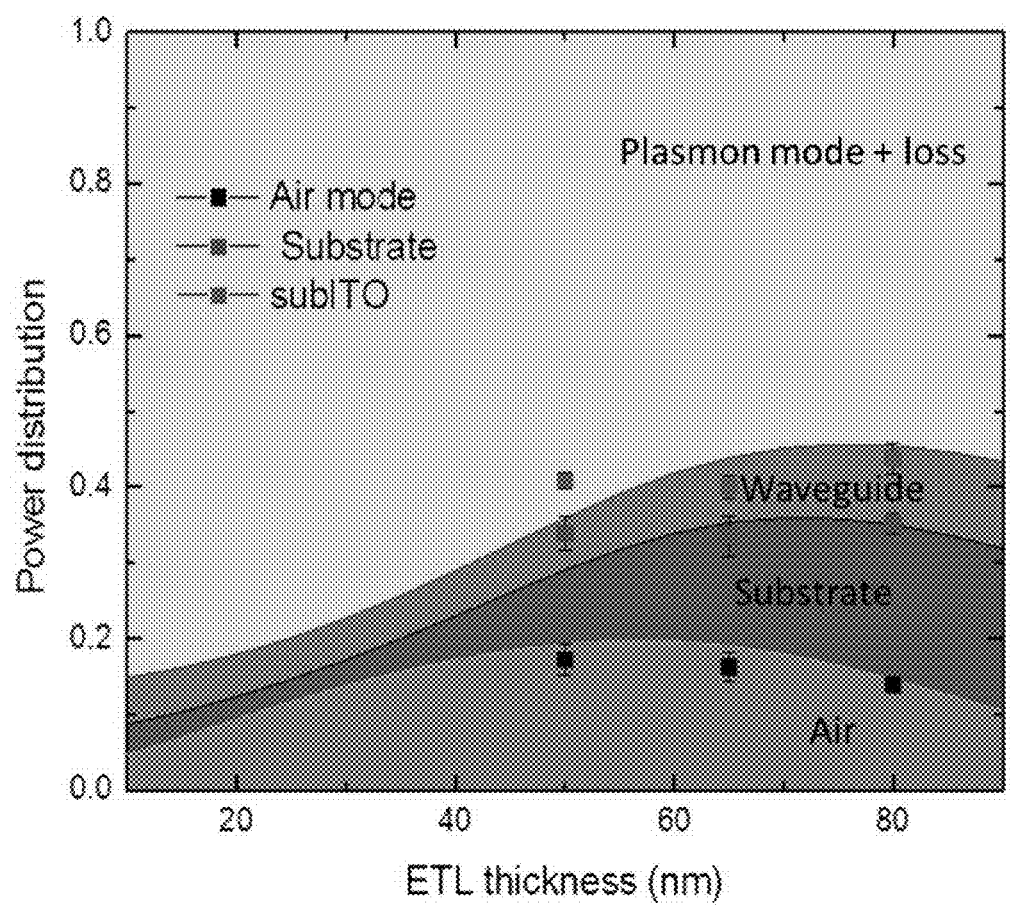
FIG. 10 is a graph of power distribution over ETL thickness according to one embodiment.
Figure 11A:
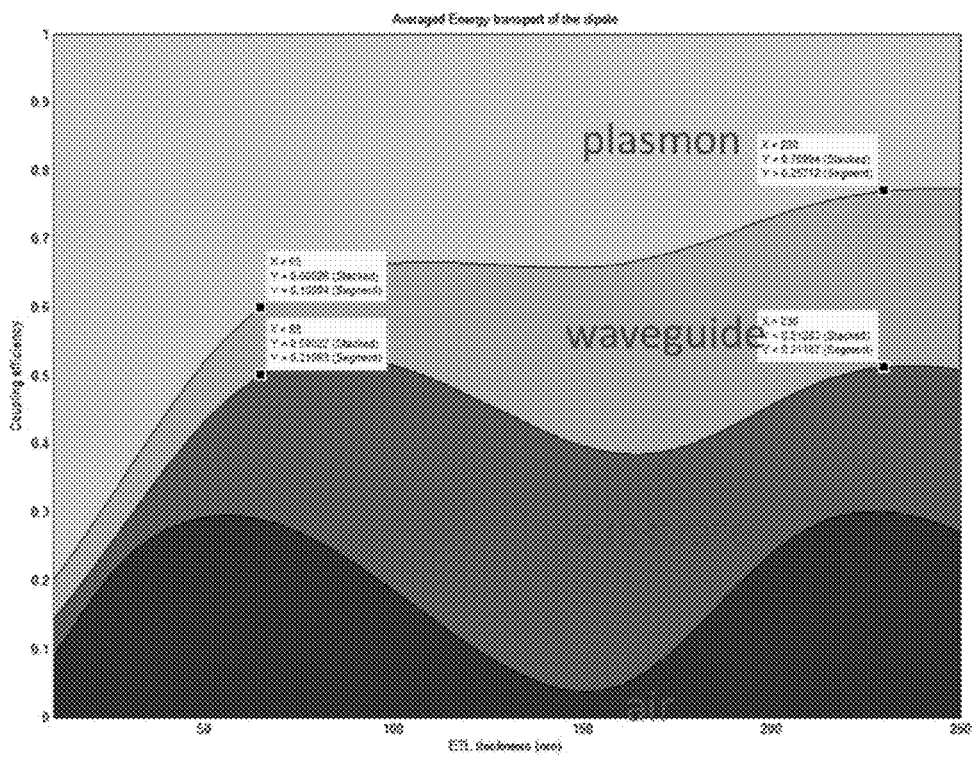
FIG. 11A is a graph of coupling efficiency over a range of ETL thicknesses.
Figure 11B:
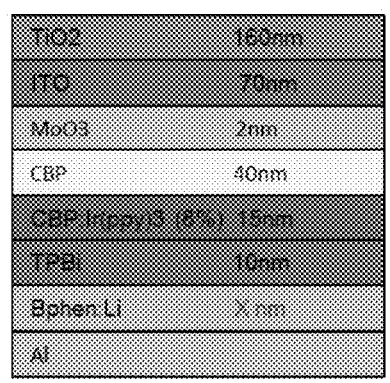
FIG. 11B is a diagram of an OLED stack illustrating examples of enhancements based on ETL thickness.
Figure 11C:
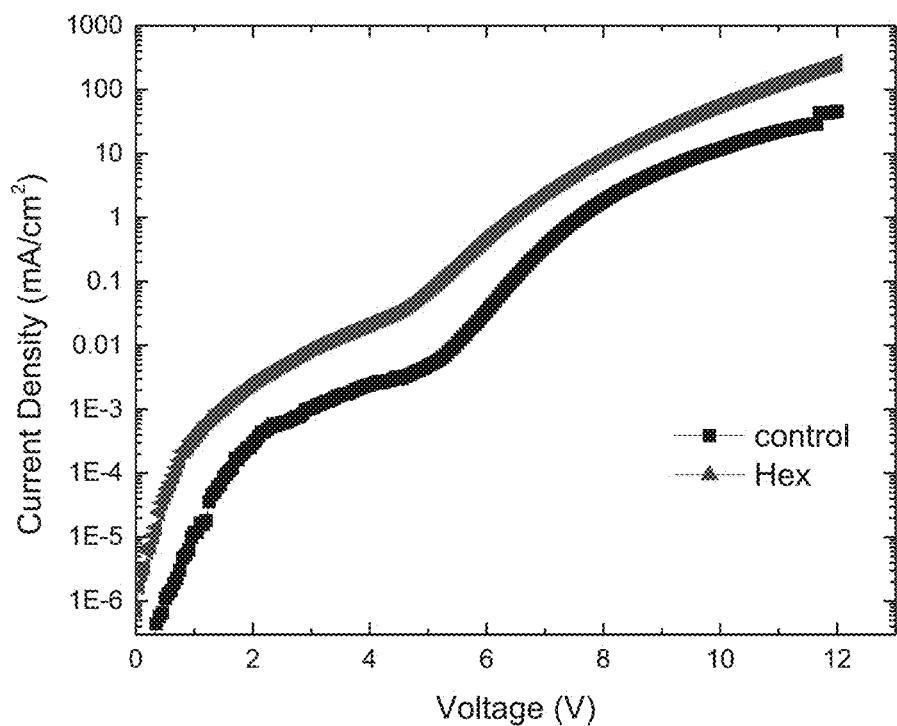
FIG. 11C is a graph of current density vs. voltage.
Figure 11D:
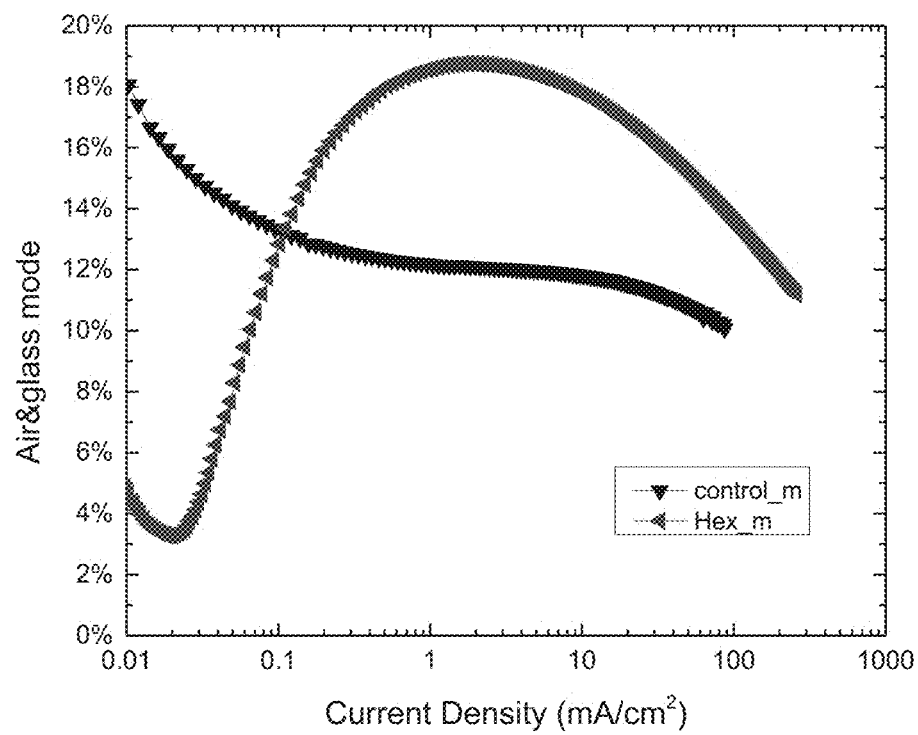
FIG. 11D is a graph of air & glass mode vs. current density, according to one embodiment.

A buried grid is shown in FIG. 9A with a step height of <8 nm and a RMS=1.1 nm. Current density for the buried grid in hexagon, square and $TiO_2$ vs. a control are shown in FIG. 9B, along with EQE (FIG. 9C) and air & glass mode (FIG. 9D) vs. current density. A graph of intensity over wavelengths spanning 400 nm to 700 nm is shown for the buried grid in hexagon, square and $TiO_2$ vs. a control in FIG. 9E. No electrical property differences were observed. A 20% enhancement for glass and air modes was observed (33.4% to 40%). A 9% enhancement of EQE was observed (16% to 17.5%). A graph of power distribution over ETL thickness is shown in FIG. 10. Sub-ITO grids out-couples most waveguide modes power. Sub-ITO grids OLEDs SQE are comparable with SQE+waveguide of conventional OLEDs. Optical power distribution is illustrated by the graphs of FIGS. 11A, 11C and 11D. A 230 nm ETL sub-ITO grid device saw a 52% improvement (from 12.2% to 18.5%). With reference to the diagram in FIG. 11B, at 65 nm ETL, a 20% enhancement is achieved, while at 230 nm ETL, an enhancement of upwards of 50% can be achieved.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting. The disclosures of each and every patent, patent application, and publication cited herein are hereby incorporated herein by reference in their entirety.

We claim:

1. An organic light emitting device, comprising:
   a transparent substrate;
   a transparent grid layer disposed over the substrate, wherein the transparent grid layer has a refractive index that is less than the refractive index of the transparent substrate; and
   an OLED disposed over the grid layer, wherein the OLED includes an anode, a cathode, and an electron transport layer having a thickness of at least 50 nm positioned between the anode and cathode.

2. The organic light emitting device of claim 1, wherein the refractive index of the transparent grid layer is less than n=1.20.

3. The organic light emitting device of claim 1, wherein the refractive index of the transparent grid layer is less than n=1.05.

4. The organic light emitting device of claim 1, wherein the grid layer comprises a material patterned at least partially within the transparent substrate.

5. The organic light emitting device of claim 4, wherein the pattern comprises a plurality of space-filling polyhedra substantially aligned in rows and columns.

6. The organic light emitting device of claim 5, wherein sides of the space-filling polyhedra have a step height of less than 10 nm.

7. The organic light emitting device of claim 5, wherein sides of the space-filling polyhedra have a step height of less than 8 nm.

8. The organic light emitting device of claim 1, wherein the grid layer comprises a material having a pattern of voids etched therein.

9. The organic light emitting device of claim 8, wherein the pattern comprises a plurality of quadrilaterals substantially aligned in rows and columns.

10. The organic light emitting device of claim 1, wherein the at least one organic layer includes an electron transport layer having a thickness of at least 200 nm.

11. The organic light emitting device of claim 1 further comprising a micro-lens array.

12. The organic light emitting device of claim 1, wherein the substrate quantum efficiency is increased by at least 40%.

13. The organic light emitting device of claim 1, wherein the external quantum efficiency is increased by at least 30%.

14. The organic light emitting device of claim 2, wherein the grid layer comprises a material patterned at least partially within the transparent substrate.

15. An organic light emitting device, comprising:
    a transparent substrate;
    a transparent grid layer disposed over the substrate, wherein the transparent grid layer has a refractive index of less than n=1.20, and less than the refractive index of the transparent substrate; and
    an OLED disposed over the grid layer, wherein the OLED includes an anode, a cathode, an emissive layer, a hole transport layer and an electron transport layer, the electron transport layer having a thickness of at least 150 nm.

16. The organic light emitting device of claim 15, wherein the grid layer comprises a material patterned at least partially within the transparent substrate.

* * * * *